United States Patent
Kim et al.

(10) Patent No.: US 11,577,623 B2
(45) Date of Patent: Feb. 14, 2023

(54) SYSTEM FOR PREDICTING BATTERY USAGE HABITS AND BATTERY DISCHARGE TENDENCIES

(71) Applicants: Hyundai Motor Company, Seoul (KR); Kia Motors Corporation, Seoul (KR); Yura Corporation Co., Ltd., Gyeonggi-do (KR)

(72) Inventors: Hyun Wook Kim, Seoul (KR); Hyun Young Kim, Gyeonggi-do (KR); Chan Young Jung, Gyeonggi-do (KR)

(73) Assignees: Hyundai Motor Company, Seoul (KR); Kia Motors Corporation, Seoul (KR); Yura Corporation Co., Ltd., Gyeonggi-do (KR)

( * ) Notice: Subject to any disclaimer, the term of this patent is extended or adjusted under 35 U.S.C. 154(b) by 532 days.

(21) Appl. No.: 16/694,347

(22) Filed: Nov. 25, 2019

(65) Prior Publication Data
US 2020/0282860 A1 Sep. 10, 2020

(30) Foreign Application Priority Data
Mar. 7, 2019 (KR) .......................... 10-2019-0026133

(51) Int. Cl.
*G01R 31/382* (2019.01)
*B60L 58/13* (2019.01)
(Continued)

(52) U.S. Cl.
CPC .............. *B60L 58/13* (2019.02); *B60L 58/16* (2019.02); *G01R 31/3648* (2013.01); *G01R 31/382* (2019.01)

(58) Field of Classification Search
CPC ..... Y02T 10/70; Y02T 10/7072; Y02T 10/72; Y02T 10/62; Y02T 90/14; Y02T 90/12; Y02T 10/92; Y02T 10/90; H02J 3/32; H02J 7/35; H02J 7/00; H02J 2310/48; H02J 7/0013; H02J 2300/30; H02J 7/0068; H02J 2310/40; H02J 3/322; H02J 7/0018; H02J 7/0048; H02J 7/007; H02J 7/04; H02J 7/0021; H02J 7/0022; H02J 7/0047; H02J 7/005; H02J 7/1423; H02J 7/02; H02J 2207/20; H02J 7/00034; H02J 7/00036; H02J 7/0302; H02J 7/00306; H02J 7/0029; H02J 7/0049; H02J 7/0031;
(Continued)

(56) References Cited

U.S. PATENT DOCUMENTS 8,975,866 B2 * 3/2015 McGrath ................. B60L 53/00 320/109
9,056,556 B1 * 6/2015 Hyde ..................... B60L 58/19
(Continued)

*Primary Examiner* — Vinh P Nguyen
(74) *Attorney, Agent, or Firm* — Fox Rothschild LLP

(57) ABSTRACT

The present invention relates to a system for predicting battery usage habits and battery discharge tendencies. The system includes a battery sensor that senses a state of charge (SOC) of a battery and a controller hat calculates battery power generation amount during driving time of a vehicle and battery consumption during parking time of the vehicle based on information sensed by the battery sensor. A storage unit for stores the battery power generation amount, the battery consumption, time at which the vehicle is tuned on/off, and time at which the controller enters a sleep/wake-up state.

10 Claims, 7 Drawing Sheets

(51) Int. Cl.
*B60L 58/16* (2019.01)
*G01R 31/36* (2020.01)

(58) Field of Classification Search
CPC .... H02J 7/007194; H02J 7/1438; H02J 7/045; H02J 9/06; G01R 31/396; G01R 1/203; G01R 15/205; G01R 19/0092; G01R 31/3828; G01R 31/3832; G01R 31/392; G01R 31/36; G01R 31/3648; G01R 31/3842; G01R 31/385; G01R 31/388; G06F 1/26; H04W 4/14; B60L 53/14; B60L 58/15; B60L 58/22; B60L 3/12; B60L 2240/72; B60L 3/0046; B60L 3/04; B60L 53/66; B60L 53/68; B60L 58/12; B60L 58/13; B60L 58/40; B60L 2260/54; B60L 2270/32; B60L 53/11; B60L 2240/486; B60L 2240/527; B60L 2240/529; B60L 2240/62; B60L 2270/36; B60L 3/00; B60L 3/0023; B60L 50/61; B60L 50/64; B60L 53/00; B60L 53/22; B60L 53/53; B60L 53/54; B60L 2240/549
See application file for complete search history.

(56) References Cited

U.S. PATENT DOCUMENTS

| | | | |
|---|---|---|---|
| 9,160,037 B2* | 10/2015 | Park | B60L 50/52 |
| 9,614,258 B2* | 4/2017 | Takahashi | H01M 10/48 |
| 9,956,887 B2* | 5/2018 | Duan | B60W 50/14 |
| 10,328,816 B2* | 6/2019 | Ichikawa | B60L 50/15 |
| 10,817,277 B2* | 10/2020 | Jeong | G06F 8/65 |
| 11,072,258 B2* | 7/2021 | Kumar | B60L 50/60 |
| 11,283,283 B2* | 3/2022 | Daniels | H02J 9/00 |

* cited by examiner

FIG. 7

[JUDGEMENT RESULT TABLE]

| CHAGED STATE OF SOC OF BATTERY | BATTERY DISCHARGE TENDENCIES ANALYSIS | RESULT | ALARM MESSAGE |
|---|---|---|---|
| GOOD(x ≥ 85%) | (NORMAL) AVERAGE CONSUMPTION RELATIVE TO AVERAGE POWER GENERATION AMOUNT IS EQUAL TO OR HIGHER THAN 1 | BATTERY IS IN GOOD CONDITION AND DRIVER HAS TENDENCY TO USE BATTERY FOR LONG TIME | "BATTERY IS BEING USED PREPERLY AND RELIABLY" |
| | (DANGEROUS) AVERAGE CONSUMPTION RELATIVE TO AVERAGE POWER GENERATION AMOUNT IS LESS THAN 1 | BATTERY IS IN GOOD CONDITION AND DRIVER HAS TENDENCY TO ACCELERATE REPLACEMENT OF BATTERY | "DRIVING TIME SHOULD BE INCREASED LITTLE MORE" |
| NORMAL (85> x ≥ 65%) | (NORMAL) AVERAGE CONSUMPTION RELATIVE TO AVERAGE POWER GENERATION AMOUNT IS EQUAL TO OR HIGHER THAN 1 | BATTERY IS IN NOMAL CONDITION AND DRIVER HAS TENDENCY TO USE BATTERY FOR LONG TIME | "SOME DETERIORATION OF BATTERY PERFORMANCE IS IN PROGRESS AND REPLACEMENT IS NOT NECESSARY" |
| | (DANGEROUS) AVERAGE CONSUMPTION RELATIVE TO AVERAGE POWER GENERATION AMOUNT IS LESS THAN 1 | BATTERY IS IN NOMAL CONDITION AND DRIVER HAS TENDENCY TO ACCELERATE REPLACEMENT OF BATTERY | "DRIVING TIME NEEDS TO BE INCREASED MORE, BATTERY CAN BE DISCHARGED WHEN NO ACTION IS TAKEN" |
| BAD(x <65%) | (NORMAL) AVERAGE CONSUMPTION RELATIVE TO AVERAGE POWER GENERATION AMOUNT IS EQUAL TO OR HIGHER THAN 1 | BATTERY IS IN BAD CONDITION AND DRIVER HAS TENDENCY TO USE BATTERY FOR LONG TIME | "REPLACEMENT DIAGNOSIS OF BATTERY IS REQUIRED" |
| | (DANGEROUS) AVERAGE CONSUMPTION RELATIVE TO AVERAGE POWER GENERATION AMOUNT IS LESS THAN 1 | BATTERY IS IN BAD CONDITION AND DRIVER HAS TENDENCY TO ACCELERATE REPLACEMENT OF BATTERY | "IT IS NECESSARY TO JUDGE WHETHER OR NOT BATTERY IS REPLACED AFTER FURTHER DRIVING" | ents

SYSTEM FOR PREDICTING BATTERY USAGE HABITS AND BATTERY DISCHARGE TENDENCIES

CROSS REFERENCE TO RELATED APPLICATION

The present application claims priority to Korean Patent Application No. 10-2019-0026133, filed Mar. 7, 2019, the entire contents of which is incorporated herein for all purposes by this reference.

BACKGROUND

Field of the Invention

The present invention relates generally to a system for predicting battery usage habits and battery discharge tendencies and, more particularly, to a system for predicting battery usage using a battery sensor, the system predicting battery usage habits of a driver and battery discharge tendencies using the battery sensor.

Description of the Related Art

Generally, a battery for a vehicle supplies operating power to various electric loads and various controllers but has a dramatic reduction in performance when discharged. Recently, an intelligent battery sensor (IBS) that monitors the battery of the vehicle has been mounted within vehicles. The IBS predicts an electrolyte temperature, a state of charge (SOC), and an aging degree of the battery and transmits prediction values to a controller via a local interconnect network (LIN). The controller then determines control conditions of an alternator management system and an idle stop & go (ISG) using the prediction values.

The battery sensor calculates the SOC of the battery by adding an integral of a current change amount to an initial value of the battery. Information measured by the battery sensor is used by the controller to operate a generator. However, when the parking time is long or driving time is short, the battery for the vehicle is easily discharged, thus decreasing the lifespan of the battery. Since the conventional battery sensor senses only the SOC of the battery, deterioration of battery performance may not be prevented.

SUMMARY

Accordingly, the present invention provides a system for predicting battery usage habits and battery discharge tendencies, the system predicting the battery usage habits of a driver and the battery discharge tendencies through a SOC of a battery, time at which a vehicle is turned on/off, and time at which a controller enters a sleep/wake-up state sensed by a battery sensor.

In order to achieve the above object, according to one aspect of the present invention, a system is provided for predicting the battery usage habits and the battery discharge tendencies according to an exemplary embodiment of the present invention. The system for predicting the battery usage habits and the battery discharge tendencies may include: a battery sensor configured to sense a state of charge (SOC) of a battery; a controller configured to calculate battery power generation amount during driving time of a vehicle and battery consumption during parking time of the vehicle based on information sensed by the battery sensor; and a storage unit configured to store the battery power generation amount, the battery consumption, time at which the vehicle is tuned on/off, and time at which the controller enters a sleep/wake-up state.

The battery usage habits may be determined based on the SOC of the battery calculated based on the battery consumption and the battery power generation amount, and when the SOC of the battery is higher the battery usage habits may be determined to be satisfactory. The battery discharge tendencies may be determined by detecting whether the average power generation amount of the battery to the average consumption of the battery is equal to or greater than a pre-set reference value. The battery sensor maybe configured to measure the time at which the vehicle is tuned on/off and the time at which the controller enters the sleep/wake-up state, and transmit the information to the controller. The battery power generation amount and the battery consumption may be calculated based on one cycle, and the one cycle may mean until the controller enters the wake-up state after the sleep state and again enters the sleep state.

The average power generation amount of the battery and the average consumption of the battery may be obtained by calculating standard deviation of battery power generation amounts and battery consumptions measured during a plurality of cycles and removing a value deviated from the standard deviation. The controller may be configured to operate the storage unit to store the average power generation amount of the battery, the average consumption of the battery, an average driving time, and an average parking time, which are calculated by the battery power generation amount, the battery consumption, the time at which the vehicle is tuned on/off, and the time at which the controller enters the sleep/wake-up state calculated after the one cycle is finished.

The battery power generation amount may be obtained by calculating an amount of the battery charged from when the vehicle is turned on until when the vehicle is turned off. The battery consumption may be obtained by calculating an amount of the battery discharged from when the controller enters the sleep state until when the controller enters the wake-up state. The driver may request an analysis of the battery usage habits and the battery discharge tendencies through an audio-video-navigation (AVN), and the controller may be configured to analyze the battery usage habits and the battery discharge tendencies and inform the driver of the battery usage habits and the battery discharge tendencies through the AVN. The controller may be configured to match a result of analyzing the battery discharge tendencies by the battery usage habits with a pre-stored judgement result and operate the AVN to output an alarm message. The controller may be configured to inform the driver of the battery usage habits and the battery discharge tendencies through a cluster.

According to the exemplary embodiments of the present invention, the system for predicting the battery usage habits and the battery discharge tendencies may predict the battery usage habits according to a current SOC of the battery and the battery discharge tendencies according to comparison of the average power generation amount of the battery and the average consumption of the battery, through the SOC of the battery, the time at which the vehicle is turned on/off, and the time at which the controller enters the sleep/wake-up state that are sensed by the battery sensor.

According to the exemplary embodiments of the present invention, the driver may manage the battery using information provided by the system for predicting the battery usage habits and the battery discharge tendencies, thereby preventing the battery life from being shortened. In addition, battery management as described above may reduce replacement cost of the battery.

BRIEF DESCRIPTION OF THE DRAWINGS

The above and other objects, features and other advantages of the present invention will be more clearly understood from the following detailed description when taken in conjunction with the accompanying drawings, in which:

FIG. 7 is a judgement result table according to the exemplary embodiment of the present invention.

DETAILED DESCRIPTION

Figure 1:
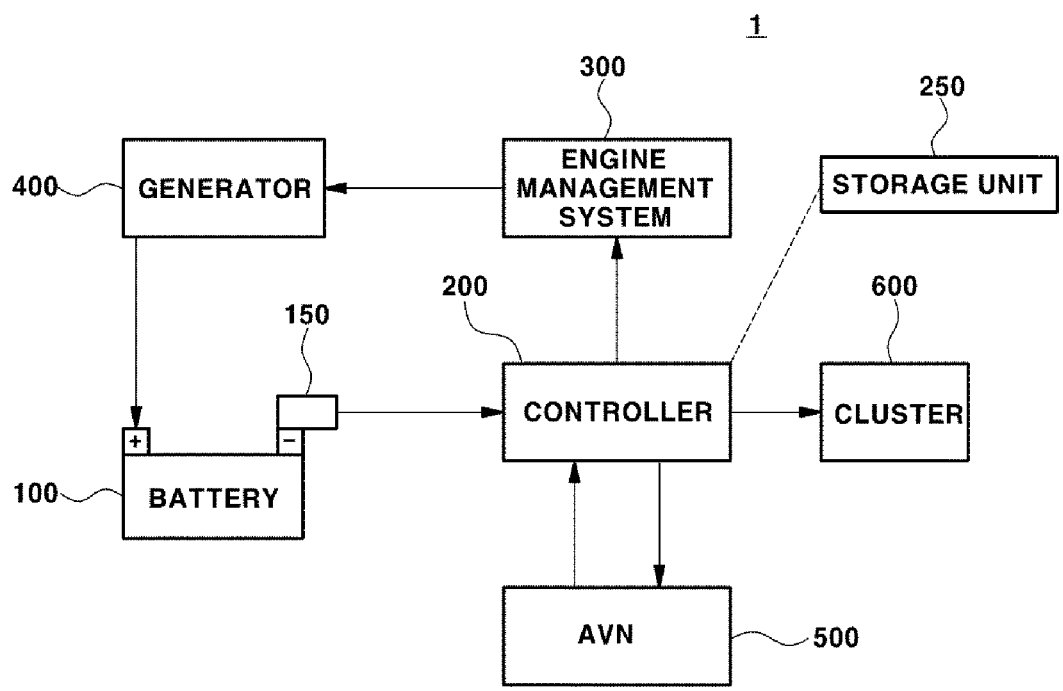
FIG. 1 is a block diagram showing a system for predicting battery usage habits and battery discharge tendencies according to an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referral to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/of" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Herein below, features and advantages of the present invention and methods for achieving them will be more clearly understood from the following detailed described exemplary embodiments with reference to the accompanying drawings Various changes to the following exemplary embodiments are possible and the scope of the present invention is not limited to the following embodiments. Exemplary embodiments of the present invention are presented to make complete disclosure of the present invention and help those who are ordinarily skilled in the art best understand the invention. Throughout the drawings, the same reference numerals will refer to the same or like parts. Also, terms such as "a first ~" and "a second ~" are used only for the purpose for distinguishing a constitutive element from another constitutive element, but a constitutive element should not be limited to the order in the following description.

The detailed description is disclosed for illustrating the present invention. In addition, the above mentioned description is intended to illustrate and explain exemplary embodiments of the present invention, and the present invention may be used in various other combinations, modifications, and environments. That is, the present invention may be changed or modified within a scope of a concept of the present invention disclosed in the description, within a scope of equivalents to the disclosure, and/or within the skill or knowledge in the art to which the present invention belongs. The described exemplary embodiments illustrate the best mode for realizing the technical sprits of the present invention, and various modifications required in specific applications and uses of the present invention are possible. Therefore, the above detailed description is not intended to limit the present invention to the disclosed exemplary embodiments. In addition, it is should be understand that the accompanying claims include other embodiments.

FIG. 1 is a block diagram showing a system for predicting battery usage habits and battery discharge tendencies according to an exemplary embodiment of the present invention. Referring to FIG. 1, the system for predicting the battery usage habits and the battery discharge tendencies 1 may include a battery 100, a battery sensor 150, a controller (ICU, 200), an engine management system (EMS, 300), a generator 400, an audio-video-navigation (AVN, 500), and a cluster 600. The controller may be configured to operate the other components of the system.

In particular, the battery 100 may be installed in a vehicle and may be configured to supply operating power to various electric loads and various controllers. The battery 100 may be discharged during parking time, and may be charged during driving time by driving the generator 400. The battery sensor 150 may be configured to calculate a state of charge (SOC) of the battery by adding the integral of a current change amount to an initial value of the battery. In addition, the battery sensor 150 may be configured to sense time at which the vehicle is turned on/off, time at which the controller 200 enters a sleep/wake-up state, and the SOC of the battery. A SOC of the battery is data obtained by quantifying the SOC of the battery 100 and is a value calculated as a percentage of a residual capacity of the battery with respect to a total battery capacity.

The battery sensor 150 may be installed in a negative (−) terminal of the battery 100, and may be supplied b+ power. The battery sensor 150 may be configured to transmit information of predicting electrolyte temperature of the battery 100, the SOC of the battery, and aging degree of the battery to the controller 200 through a local interconnect network (LIN) communication. The controller 200 may be configured to operate the EMS 300 and determine the battery usage habits of a driver and the battery discharge tendencies based on the information transmitted from the battery sensor 150. The controller 200 may be configured to determine a management condition of an alternator management system and an idle stop and go, and the like using the information transmitted from the battery sensor 150.

The controller 200 may be configured to operate the generator 400 to generate by transmitting the information received from the battery sensor 150 to the EMS 300. In particular, the EMS 300 may control a generation of the generator 400 based on the SOC of the battery. When the vehicle is being driven, the battery 100 may be charged by operation of the generator 400. The controller 200 may be configured to calculate battery power generation amount during vehicle driving time and battery consumption during vehicle parking time. Based on the time at which the vehicle is turned on/off, the time at which the controller 200 enters the sleep/wake-up state, and the SOC of the battery that are sensed by the battery sensor 150, the controller 200 may be configured to calculate the battery power generation amount and the battery consumption. Particularly, the SOC of the battery may be calculated by adding the battery power generation amount and the battery consumption.

The controller 200 may be configured to obtain the driving time by calculating the amount of time from when the vehicle is turned on until when the vehicle is turned off. In addition, the controller 200 may be configured to calculate a change value of the SOC of the battery by comparing SOC immediately after the vehicle is turned on with SOC immediately after the vehicle is turned off. The change value of the SOC of the battery may indicate the battery power generation amount. The controller 200 may be configured to calculate the vehicle parking time using the time at which the controller 200 enters the sleep state and the time at which the controller 200 enters the wake-up state. In addition, the controller 200 may be configured to calculate the change value of the SOC of the battery by comparing SOC of the battery when the controller 200 enters the sleep state and SOC of the battery when the controller 200 enters the wake-up state. The change value of the SOC of the battery may indicate the battery consumption.

The battery power generation amount and the battery consumption may be calculated based on one cycle. The one cycle may mean until the controller 200 enters the wake-upstate after the sleep state and then again enters the sleep state. The controller 200 may be configured to calculate an average power generation amount of the battery and average consumption of the battery based on the battery power generation amount and the battery consumption. The average power generation amount of the battery may be obtained by multiplying average driving time and hourly generation amount. The hourly generation amount may be a total battery power generation amount to total driving time. The average consumption of the battery may be a value obtained by multiplying average parking time and hourly consumption. The hourly consumption may be total battery consumption to total parking time.

AVERAGE BATTERY POWER GENERATION AMOUNT =

AVERAGE DRIVING TIME × HOURLY GENERATION AMOUNT

AVERAGE BATTERY CONSUMPTION =

AVERAGE PARKING TIME × HOURLY CONSUMPTION $$\text{HOURLY GENERATION AMOUNT} = \frac{\text{TOTAL POWER GENERATION AMOUNT}}{\text{TOTAL DRIVING TIME}}$$

$$\text{HOURLY CONSUMPTION} = \frac{\text{TOTAL BATTERY CONSUMPTION}}{\text{TOTAL PARKING TIME}}$$

The average power generation amount of the battery and the average consumption of the battery may be obtained by calculating standard deviation of battery power generation amounts and battery consumptions measured during a plurality of cycles, and removing a value deviated from the standard deviation. The controller 200 may be configured to calculate the average parking time and the average driving time. The average parking time may indicate the total parking time to a total number of cycles. The average driving time may indicate the total driving time to the total number of cycles.

$$\text{AVERAGE PARKING TIME} = \frac{\text{TOTAL PARKING TIME}}{\text{TOTAL NUMBER OF CYCLES}}$$

$$\text{AVERAGE DRIVING TIME} = \frac{\text{TOTAL DRIVING TIME}}{\text{TOTAL NUMBER OF CYCLES}}$$

The controller 200 may be configured to store data on the calculated parking time, driving time, battery consumption, battery power generation amount, hourly battery consumption, hourly battery power generation amount, average consumption of the battery, average power generation amount of the battery, average parking time, and average driving time in a storage unit 250. In addition, the controller 200 may be configured to store data regarding the parking time, driving time, battery consumption, battery power generation amount, hourly battery consumption, hourly battery power generation amount, average consumption of the battery, average power generation amount of the battery, average parking time, and average driving time calculated at the end of each cycle in the storage unit 250. The data stored in the storage unit 250 may be arranged in the following table.

The controller 200 may be configured to detect the battery usage habits of the driver and the battery discharge tendencies based on the SOC of the battery, the average power generation amount of the battery, and the average consumption of the battery. The battery usage habits may be determined based on the SOC of the battery calculated from the battery consumption and the battery power generation amount. The higher SOC of the battery may indicate that the battery usage habits are satisfactory. For example, the SOC of the battery may indicate an average SOC of the battery. The battery discharge tendencies may be determined by detecting whether the average power generation amount of the battery to the average consumption of the battery is equal to, greater than, or is less than a pre-set reference value. For example, the reference value may be one. When the average power generation amount of the battery to the average consumption of the battery is equal to or greater than one, the battery 100 may be determined to be in a normal state, and when the average power generation amount of the battery to the average consumption of the battery is less than one, the battery 100 may be determined to be in a dangerous state.

$$\frac{\text{AVERAGE DRIVING TIME} \times \text{HOURLY GENERATION AMOUNT}}{\text{AVERAGE PARKING TIME} \times \text{HOURLY CONSUMPTION}} =$$
$$\frac{\text{AVERAGE POWER GENERATION AMOUNT}}{\text{AVERAGE BATTERY CONSUMPTION}} \geq 1 = \text{NORMAL STATE}$$

$$\frac{\text{AVERAGE DRIVING TIME} \times \text{HOURLY GENERATION AMOUNT}}{\text{AVERAGE PARKING TIME} \times \text{HOURLY CONSUMPTION}} =$$
$$\frac{\text{AVERAGE POWER GENERATION AMOUNT}}{\text{AVERAGE BATTERY CONSUMPTION}} < 1 - \text{DANGEROUS STATE}$$

The controller 200 may be configured to analyze the battery usage habits and the battery discharge tendencies based on the information stored in the storage unit 250 when the driver requests a battery usage habits and battery discharge tendencies analysis. The driver may request battery usage habits and battery discharge tendencies analysis through the AVN 500. The AVN 500 may be a component which is integrated with an audio system, a multimedia device, and a navigation device and realized in a single system. The AVN 500 may refer to a device configured to provide a multimedia function for outputting a driving route and driving information and music, video, and broadcast to a driver when the vehicle is being driven. The AVN 500 may include an input unit for ordering performance of work and a display unit configured to display a performance result of work.

The input unit may be provided in a type of hard keys in an area adjacent to the display unit, or may be provided in a form of a touch panel on the front of the display unit when the display unit itself is realized in a type of a touch screen. The display unit may be at least one of an audio screen, a video screen, and a navigation screen, and may be configured to display various control screens related to the vehicle or screens related to additional functions. The controller 200 may be configured to display the analysis result of the battery usage habits and the battery discharge tendencies through the AVN 500 and the cluster 600. The cluster 600 may be configured to perform a function of displaying to the driver various information related to the driving of the vehicle and facilities in the vehicle. In other words, the controller 200 may be configured to operate the AVN 500 and the cluster 600 thereby matching the analysis result of the battery discharge tendencies based on the battery usage habits with a pre-stored judgement result table and outputting an alarm. The judgement result table will be described hereinafter.

According to the exemplary embodiment of the present invention, the system for predicting the battery usage habits and the battery discharge tendencies 1 may be configured to predict the battery usage habits based on a current SOC of the battery and the battery discharge tendencies depending on comparison of the average power generation amount of the battery and the average consumption of the battery, based on the basis of the SOC of the battery, the time at which the vehicle is turned on/off, and the time at which the controller 200 enters the sleep/wake-up state that are measured by the battery sensor 150. The battery usage habits may be used as an indicator of how far the driver drives based on the SOC of the battery.

Prediction of the battery discharge tendencies may be used as an indicator showing whether the parking time and the driving time are appropriately distributed and whether performance of the battery 100 is deteriorated. Accordingly, the system for predicting the battery usage habits and the battery discharge tendencies 1 may inform the driver of information for managing the battery 100 efficiently depending on the battery usage habits and vehicle usage patterns of the driver. The driver may manage the battery using the information informed by the system for predicting the battery usage habits and the battery discharge tendencies 1 thereby preventing the battery life from being reduced. In addition, as the battery is managed, replacement cost of the battery may be reduced.

Figure 2:
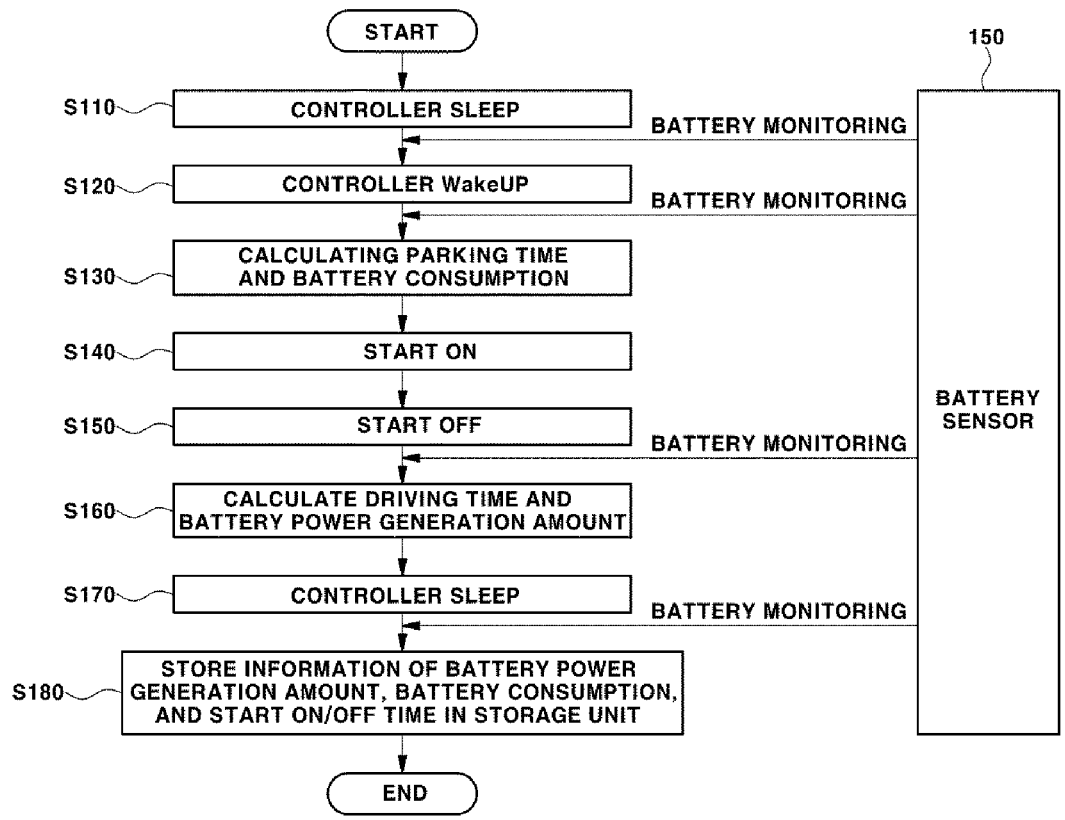
FIG. 2 is a flow chart showing a method of constructing a database for predicting the battery usage habits and the battery discharge tendencies according to the exemplary embodiment of the present invention.

FIG. 2 is a flow chart showing a method of constructing a database for predicting the battery usage habits and the battery discharge tendencies according to the exemplary embodiment of the present invention. Referring to FIGS. 1 and 2, the controller (ICU, 200) may enter the sleep state after the vehicle is turned off. Immediately after the controller 200 enters the sleep state, the battery sensor 150 may be configured to measure SOC of the battery and time at which the controller 200 enters the sleep state (S110).

The controller 200 may enter the wake-up state before the vehicle is turned on. Immediately after the controller 200 enters the wake-up state, the battery sensor 150 may be configured to measure SOC of the battery and time at which the controller 200 enters the wake-up state (S120). The controller 200 may be configured to determine the parking time by calculating time interval from when the controller 200 enters the sleep state until when it enters the wake-up state. In addition, the controller 200 maybe configured to calculate the battery consumption by comparing SOC of the battery measured when the controller 200 enters the sleep state and SOC of the battery measured when the controller 200 enters the wake-up state. The battery sensor 150 may be configured to measure SOC of the battery 100 and time at which the controller 200 enters the sleep state. Since the vehicle may be discharged during the parking time, the SOC of the battery may be reduced during the parking time (S130).

Additionally, the battery sensor 150 may be configured to measure time at which the vehicle is turned on and SOC of the battery at that time. In addition, the battery sensor 150 may be configured to measure time at which the vehicle is turned off after the driving is finished and SOC of the battery at that time (S140, S150). The controller 200 may be configured to determine driving time by calculating time interval from when the vehicle is turned on until when the vehicle is turned off. In addition, the controller 200 maybe configured to calculate the battery power generation amount by comparing SOC of the battery when the vehicle is turned on and SOC of the battery when the vehicle is turned off (S160). After the vehicle is turned off, the controller 200 may enter the sleep state. Time from when the controller 200 enters the wake-up state after the ICU 200 enters the sleep state and until when the controller 200 enters the sleep state may be defined as one cycle (S170).

The controller 200 maybe configured to store the information regarding battery power generation amount, battery consumption, time at which the vehicle is turned on/off, and time at which the controller 200 enters the sleep/wake-up state measured when one cycle is finished in the storage unit 250. During the plurality of cycles, the controller 200 may be configured to calculate the battery consumption, battery power generation amount, SOC of the battery, parking time, and driving time per cycle and store the information related thereto in the storage unit 250. In addition, the controller 200 may be configured to calculate average values of information accumulated during the plurality of cycles and the values them in the storage unit 250. For example, the controller 200 maybe configured to calculate the average consumption of the battery, average power generation amount of the battery, average SOC of the battery, average parking time, and average driving time, and store the information in the storage unit 250.

According to the exemplary embodiment of the present invention, the controller 200 may be configured to analyze the SOC of the battery 100 based on the information measured by the battery sensor 150 in real time. The information related to the SOC of the battery 100 may be stored in the storage unit 250. This allows the database for predicting the battery usage habits of the driver and the battery discharge tendencies hereafter to be constructed.

Figure 3:
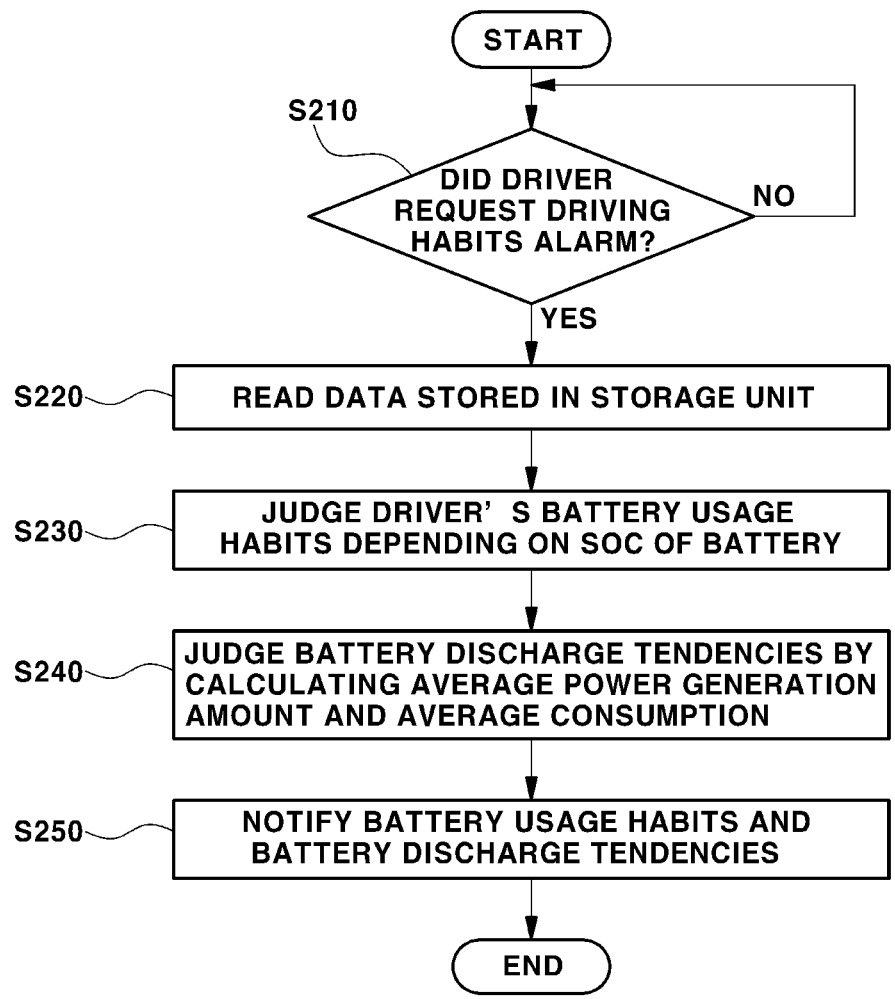
FIG. 3 is a flow chart showing a method for predicting the battery usage habits and the battery discharge tendencies according to the exemplary embodiment of the present invention.

FIG. 3 is a flow chart showing a method for predicting the battery usage habits and the battery discharge tendencies according to the exemplary embodiment of the present invention. Referring to FIGS. 1 to 3, the driver may request notification regarding driving habits of the driver through the AVN 500. The AVN 500 may be configured to request the controller 200 to perform analysis to predict the driving habits of the driver including the battery usage habits and the battery discharge tendencies (S210).

The controller 200 may be configured to read data stored in the storage unit 250 and perform the analysis to predict the battery usage habits and the battery discharge tendencies (S220). The controller 200 may be configured to detect the battery usage habits of the driver based on the SOC of the battery. In addition, the controller 200 may be configured to analyze the battery power generation amount and the battery consumption per cycle thereby calculating the SOC of the battery per cycle. The controller 200 may then be configured to determine that the higher the SOC of the battery, the better the battery usage habits of the driver. A criterion of the battery usage habits of the driver will be described hereinafter (S230).

The controller 200 maybe configured to calculate the average power generation amount of the battery and average consumption of the battery based on the battery power generation amount and the battery consumption measured during the plurality of cycles. The controller 200 may be configured to determine the battery discharge tendencies based on whether the average power generation amount of the battery to the average consumption of the battery is equal to or greater than the pre-set reference value. The controller 200 may be configured to determine that the battery 100 is in the normal state when the average power generation amount of the battery to the average consumption of the battery is equal to or greater than the reference value. The controller 200 may be configured to determine that the battery 100 is in the dangerous state when the average power generation amount of the battery to the average consumption of the battery is less than one (S240).

The controller 200 maybe configured to inform the driver of the battery usage habits and the battery discharge tendencies through the AVN 500 and the cluster 600. The notification may be output in different forms including alarm and voice messages (S250). According to the exemplary embodiment of the present invention, as the analysis result of the battery 100, the battery usage habits of the driver and the battery discharge tendencies may be derived. Accordingly, the battery usage habits and the battery discharge tendencies may be used as the indicator for the driver to manage the battery 100.

Figure 4:
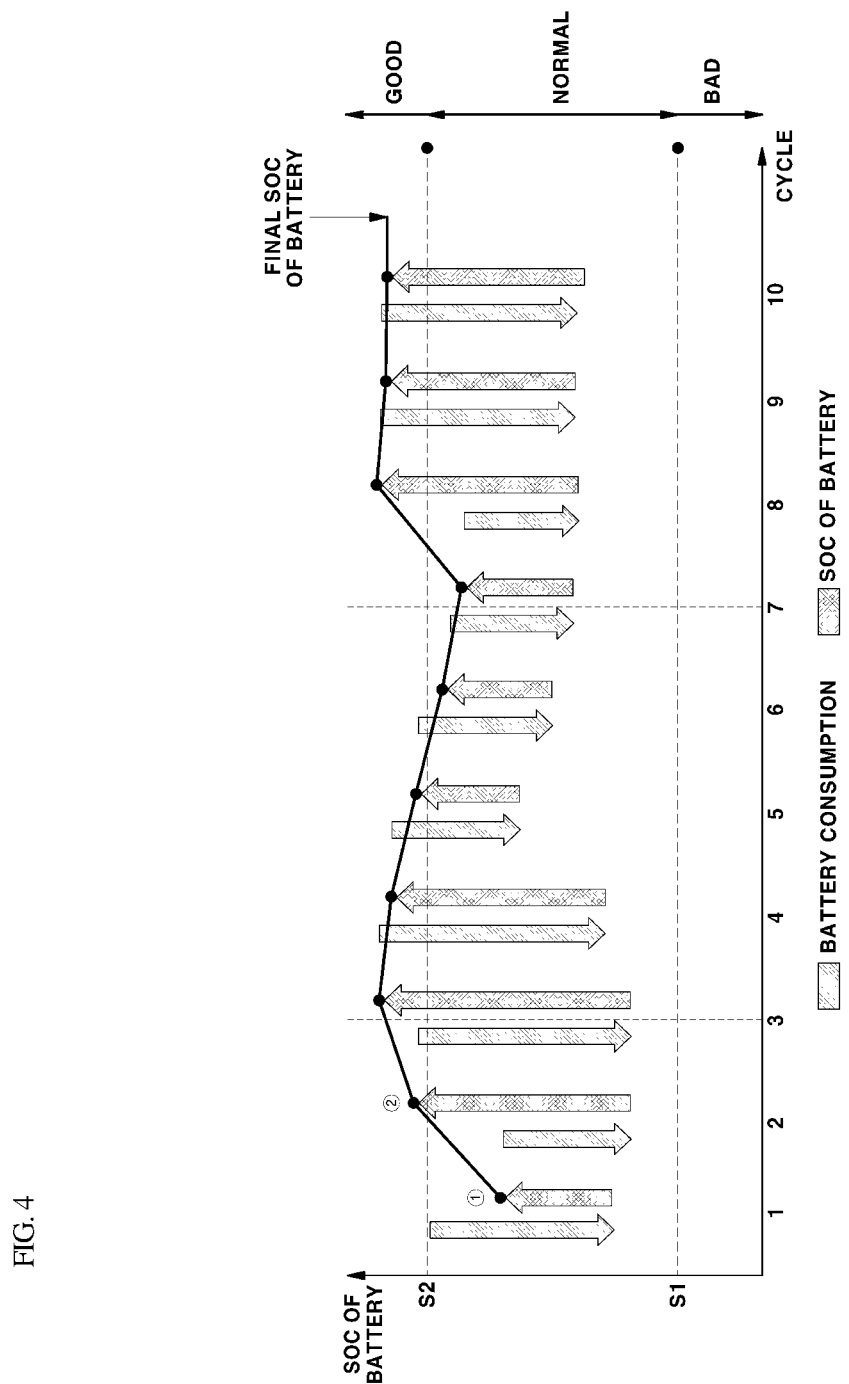
FIG. 4 is a graph showing a SOC of the battery depending on a cycle according to the exemplary embodiment of the present invention.

FIG. 4 is a graph showing SOC of the battery depending on a cycle according to the exemplary embodiment of the present invention. The X-axis indicates the number of cycles and Y-axis indicates the SOC of the battery. Referring to FIGS. 1 to 4, the battery consumption per cycle and a battery discharge amount may be derived. A value obtained by adding the battery consumption per cycle and the battery discharge amount may be defined as the SOC of the battery. In particular, the SOC of the battery may be divided into three categories including "Good", "Normal", and "Bad", and the three categories may be used as indicators of the battery usage habits of the driver.

When the SOC of the battery is equal to or less than 51, the battery usage habits of the driver may be determined as "Bad". When the SOC of the battery is greater than 51 and less than S2, the battery usage habits of the driver may be determined as "Normal". When the SOC of the battery is equal to or greater than S2, the battery usage habits of the driver may be determined as "Good". For example, 51 may be about 65% and S2 may be about 85%. However, specific values of 51 and S2 may be changed by a designer, and the number of indicators for determining the battery usage habits of the driver may be three or more.

The battery usage habits of the driver may be determined by the SOC of the battery per cycle, or may be determined by the SOC of the battery measured during the plurality of cycles. The controller 200 maybe configured to calculate average values of the battery power generation amount and the battery consumption that are measured during the plurality of cycles. The average power generation amount of the battery and the average consumption of the battery may be obtained by calculating standard deviations of battery power generation amounts and battery consumptions that are measured during the plurality of cycles, and then by removing values deviated from the standard deviations.

For example, in a first cycle ①, battery consumption after parking the vehicle is −14.4%, battery power generation amount during driving is +8%, and final SOC of the battery is 78.6%. In a second cycle ②, battery consumption after parking the vehicle is −9.6%, battery power generation amount after starting the vehicle is +18%, and final SOC of the battery of ② is 87%. SOC of the battery measured during ten cycles is 88.2%, and the controller 200 may be configured to determine that the battery usage habits of the driver correspond to "Good".

Figure 5:
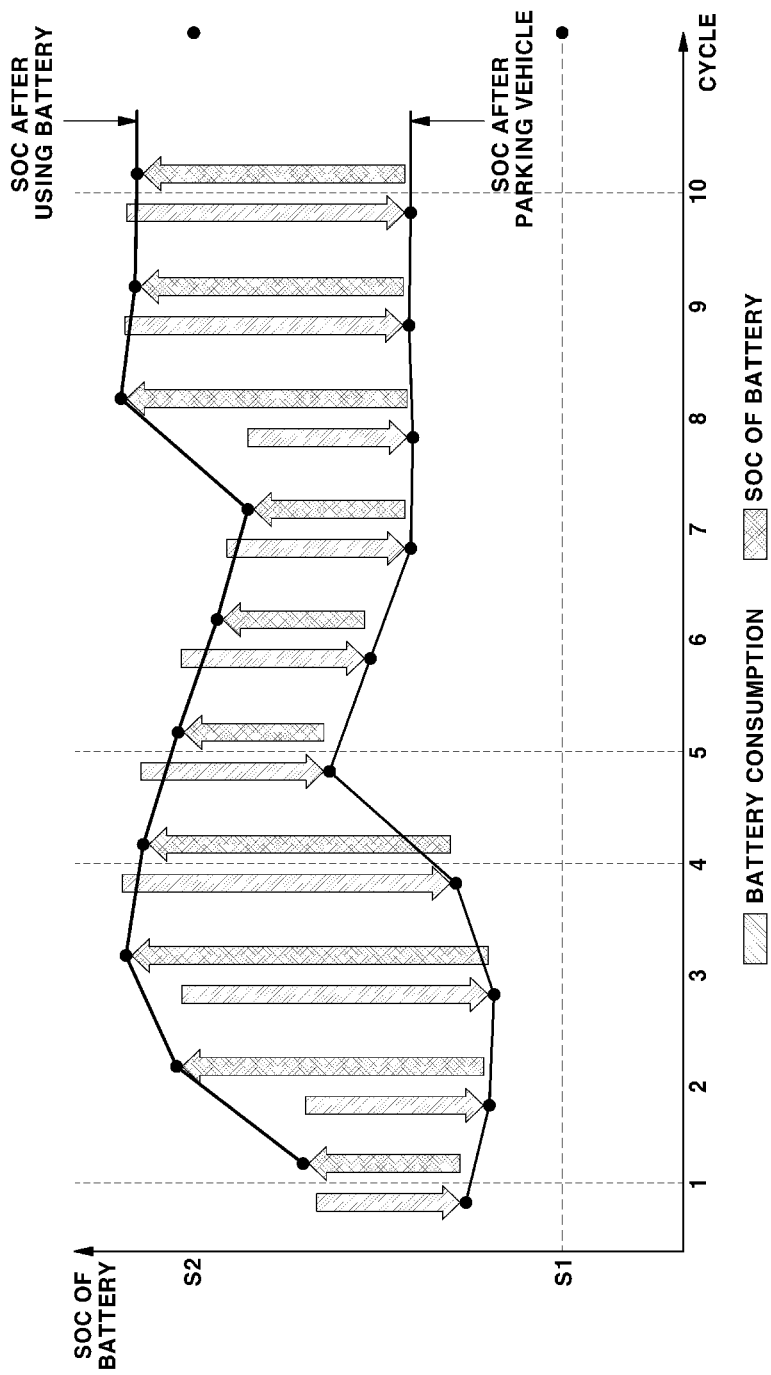
FIG. 5 is a graph showing information for predicting the battery usage habits of a driver and the battery discharge tendencies according to the exemplary embodiment of the present invention.

FIG. 5 is a graph showing information for predicting the battery usage habits of the driver and the battery discharge tendencies according to the exemplary embodiment of the present invention. Referring to FIGS. 1 to 5, the battery sensor 150 may be configured to measure SOC of the battery per one cycle. The controller 200 may be configured to calculate the battery power generation amount and battery consumption per one cycle, and calculate the average power generation amount of the battery and the average consumption of the battery based on the battery power generation amount and the battery consumption that are measured during the plurality of cycles.

The following table shows examples regarding battery consumption depending on parking time per cycle and battery power generation amount depending on driving time per cycle.

TABLE 1

| Cycle | Battery consumption DB | | Battery power generation DB | |
|---|---|---|---|---|
| | Parking time | Battery consumption | Driving time | Battery power generation amount |
| 1 | 36 | −14.4% | 0.5 | +8% |
| 2 | 24 | −9.6% | 1.0 | +16% |
| 3 | 36 | 14.4% | 1.5 | +24% |
| 4 | 48 | −19.2% | 1.0 | +16% |
| 5 | 24 | −9.6% | 0.5 | +8% |
| 6 | 24 | −9.6% | 0.5 | +8% |
| 7 | 24 | −9.6% | 0.5 | +8% |
| 8 | 24 | −9.6% | 1.0 | +16% |
| 9 | 36 | −14.4% | 1.0 | +16% |
| 10 | 36 | −14.4% | 1.0 | +16% |
| Average | 31.2 hours parking | 0.4% decreasing per hour | 0.9 hours driving | 16% increasing per hour |
| | Average consumption of the battery | 12.48% | Average power generation amount of the battery | +14.4% |

As an analysis result of the battery usage habits of the driver, average SOC of the battery may be maintained at 85% or greater, and thus, the battery usage habits of the driver may be determined as "Good". In addition, as an analysis result of the battery discharge tendencies, the battery discharge tendencies may be determined as the normal state according to the following expression.

$$\frac{\text{AVERAGE POWER GENERATION}}{\text{AVERAGE CONSUMPTION}} = \frac{14.4}{12.4} = 1.16 > 1 = \text{NORMAL STATE}$$

Figure 6:
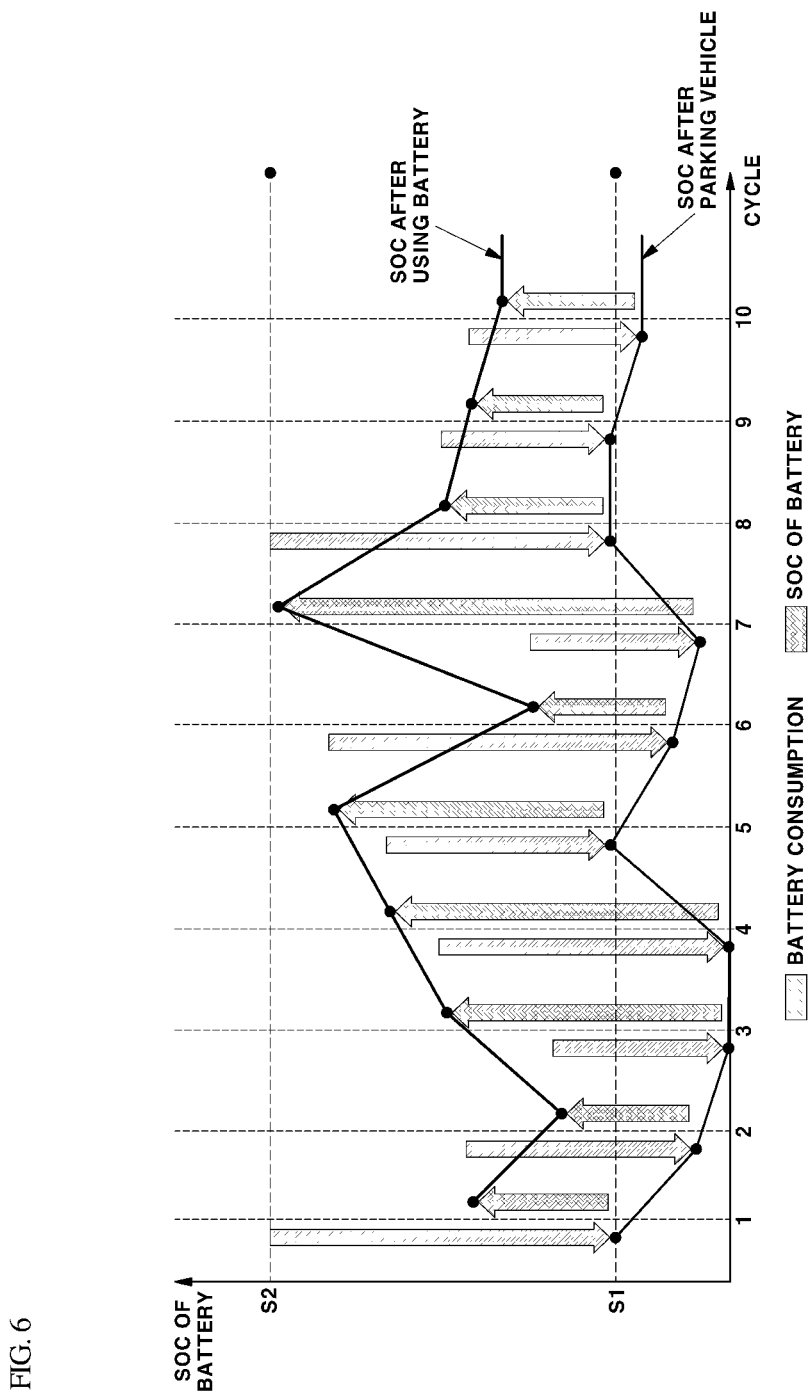
FIG. 6 is a graph showing information for predicting the battery usage habits of the driver and the battery discharge tendencies according to another embodiment of the present invention.

FIG. 6 is a graph showing information for predicting the battery usage habits of the driver and the battery discharge tendencies according to another exemplary embodiment of the present invention. Referring to FIGS. 1 to 6, the average SOC of the battery may have a value between about 65% and 85%. As average values calculated by the battery power generation amount and the battery consumption that are measured during 10 cycles, average consumption of the battery is about 14.08% and average power generation amount of the battery is about 10.71%.

As an analysis result of the battery usage habits of the driver, average SOC of the battery may be maintained at a value between about 65% and 85%, and thus, the battery usage habits may be determined as "Normal". In addition, as an analysis result of the battery discharge tendencies, the battery discharge tendencies may be determined as the dangerous state according to the following expression.

$$\frac{\text{AVERAGE POWER GENERATION}}{\text{AVERAGE CONSUMPTION}} = \frac{10.71}{14.08} = 0.76 < 1 = \text{DANGEROUS STATE}$$

FIG. 7 is a judgement result table according to the exemplary embodiment of the present invention. Referring to FIGS. 1 to 7, the controller 200 maybe configured to inform the driver of the analysis result of the battery usage habits of the driver and the battery discharge tendencies through the AVN 500 and the cluster 600. FIG. 7 shows the analysis result of the battery discharge tendencies to the battery usage habits.

When battery usage habits of the driver are "Good" and a battery discharge tendency is "Normal", the analysis result shows that the battery 100 is in good condition and the driver has a tendency to use the battery 100 for a long period of time. Particularly, the AVN 500 and the cluster 600 maybe configured to output an alarm message "The battery is being used properly and reliably". When battery usage habits of the driver are "Good" and a battery discharge tendency is "Dangerous", the analysis result shows that the battery 100 is in good condition and the driver has a tendency to accelerate replacement of the battery 100. Particularly, the AVN 500 and the cluster 600 may be configured to output an alarm message "The driving time should be increased". When the driving time is increased, the battery power generation amount is increased, and thus, the battery discharge tendencies may be changed from the dangerous state to the normal state.

When battery usage habits of the driver are "Normal" and a battery discharge tendency is "Normal", the analysis result shows that the battery 100 is in normal condition and the driver has the tendency to use the battery 100 for a long period of time. Particularly, the AVN 500 and the cluster 600 may be configured to output an alarm message "Some deterioration of battery performance is in progress and replacement is not necessary". When battery usage habits of the driver are "Normal" and a battery discharge tendency is "Dangerous", the analysis result shows that the battery 100 is in normal condition and the driver has the tendency to accelerate the need for replacement of the battery 100. Particularly, the AVN 500 and the cluster 600 may be configured to output an alarm message "The driving time needs to be further increased, and battery maybe discharged when no action is taken".

When battery usage habits of the driver are "Bad" and a battery discharge tendency is "Normal", the analysis result shows that the battery 100 is in bad condition and the driver has the tendency to use the battery 100 for a long period of time. Particularly, the AVN 500 and the cluster 600 maybe configured to output an alarm message "Replacement diagnosis of the battery is required". When battery usage habits of the driver are "Bad" and a battery discharge tendency is "Dangerous", the analysis result shows that the battery 100 is in bad condition and the driver has the tendency to accelerate the need for replacement of the battery 100. Particularly, the AVN 500 and the cluster 600 may be configured to output an alarm message "It is necessary to determine whether the battery is replaced after further driving". The alarm messages described above may be changed according to the analysis result, and specific contents of the alarm messages may be changed by the designer.

According to the exemplary embodiments of the present invention, the driver maybe informed of the result of the battery analysis, and thus, the driver may manage the battery hereafter. Accordingly, since the battery maybe replaced as late as possible, the replacement cost of the battery maybe reduced.

Although the exemplary embodiments of the present invention have been described for illustrative purposes, those skilled in the art will appreciate that various modifications, additions and substitutions are possible, without departing from the scope and spirit of the invention as disclosed in the accompanying claims. Therefore, it should be understood that the exemplary embodiments described above are illustrative rather than restrictive in all aspects.

What is claimed is:

1. A system for predicting battery usage habits and battery discharge tendencies, comprising:
   a battery sensor configured to sense a state of charge (SOC) of a battery;
   a controller configured to calculate battery power generation amount during driving time of a vehicle and battery consumption during parking time of the vehicle based on information sensed by the battery sensor; and
   a storage unit configured to store the battery power generation amount, the battery consumption, time at which the vehicle is tuned on/off, and time at which the controller enters a sleep/wake-up state,
   wherein the controller is configured to determine the battery usage habits of a driver and the battery discharge tendencies based on the SOC of the battery, an average power generation amount of the battery, and an average consumption of the battery,
   wherein the average power generation amount of the battery is obtained by a product of an average driving time and an hourly generation amount, and the hourly generation amount is obtained by a ratio of a total battery power generation amount to a total driving time,
   wherein the average consumption of the battery is a product average parking time and hourly consumption and the hourly consumption is total battery consumption to total parking time,
   wherein the battery usage habits are determined based on the SOC of the battery calculated based on the battery consumption and the battery power generation amount, and when the SOC of the battery is higher, the battery usage habits are determined to be satisfactory, and
   wherein the battery discharge tendencies are determined by determining whether the average power generation amount of the battery to the average consumption of the battery is equal to or greater than a pre-set reference value.

2. The system for predicting the battery usage habits and the battery discharge tendencies of claim 1, wherein the battery sensor is configured to measure the time at which the vehicle is tuned on/off and the time at which the controller enters the sleep/wake-up state and transmit measured time to the controller.

3. The system for predicting the battery usage habits and the battery discharge tendencies of claim 1, wherein the battery consumption and the battery power generation amount are calculated based on one cycle, and the one cycle indicates until the controller enters the wake-up state after the sleep state and again enters the sleep state.

4. The system for predicting the battery usage habits and the battery discharge tendencies of claim 3, wherein the average power generation amount of the battery and the average consumption of the battery are obtained by calculating standard deviation of battery power generation amounts and battery consumptions measured during a plurality of cycles and removing battery power generation amounts and battery consumption deviated from the standard deviations.

5. The system for predicting the battery usage habits and the battery discharge tendencies of claim 3, wherein the controller is configured to operate the storage unit to store the average power generation amount of the battery, the average consumption of the battery, an average driving time, and an average parking time, which are calculated by the battery power generation amount, the battery consumption, the time at which the vehicle is tuned on/off, and the time at which the controller enters the sleep/wake-up state calculated after the one cycle is finished.

6. The system for predicting the battery usage habits and the battery discharge tendencies of claim 1, wherein the battery power generation amount is obtained by calculating an amount of the battery charged from when the vehicle is turned on until when the vehicle is turned off.

7. The system for predicting the battery usage habits and the battery discharge tendencies of claim 1, wherein the battery consumption is obtained by calculating an amount of the battery consumption from when the controller enters the sleep state until when the controller enters the wake-up state.

8. The system for predicting the battery usage habits and the battery discharge tendencies of claim 1, wherein an analysis of the battery usage habits and the battery discharge tendencies is received as a user input through an audio-video-navigation (AVN), and the controller is configured to analyze the battery usage habits and the battery discharge tendencies and output a notification to the driver of the battery usage habits and the battery discharge tendencies through the AVN.

9. The system for predicting the battery usage habits and the battery discharge tendencies of claim 8, wherein the controller is configured to match a result of analyzing the battery discharge tendencies by the battery usage habits with a pre-stored judgement result and operate the AVN to output an alarm message.

10. The system for predicting the battery usage habits and the battery discharge tendencies of claim 8, wherein the controller is configured to output the notification to the driver of the battery usage habits and the battery discharge tendencies through a cluster.

* * * * *